(12) United States Patent
Willmeroth et al.

(10) Patent No.: US 10,490,656 B2
(45) Date of Patent: Nov. 26, 2019

(54) CHARGE-COMPENSATION SEMICONDUCTOR DEVICE AND A MANUFACTURING METHOD THEREFOR

(71) Applicant: Infineon Technologies Austria AG, Villach (AT)

(72) Inventors: Armin Willmeroth, Friedberg (DE); Franz Hirler, Isen (DE); Anton Mauder, Kolbermoor (DE); Frank Dieter Pfirsch, Munich (DE); Hans-Joachim Schulze, Taufkirchen (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/031,113

(22) Filed: Jul. 10, 2018

(65) Prior Publication Data

US 2019/0019887 A1    Jan. 17, 2019

(30) Foreign Application Priority Data

Jul. 11, 2017    (DE) .................. 10 2017 115 536

(51) Int. Cl.
| | |
|---|---|
| *H01L 29/78* | (2006.01) |
| *H01H 9/54* | (2006.01) |
| *H01L 49/02* | (2006.01) |
| *H01L 29/06* | (2006.01) |
| *H01L 29/10* | (2006.01) |

(Continued)

(52) U.S. Cl.
CPC .......... *H01L 29/7804* (2013.01); *H01H 9/54* (2013.01); *H01L 28/20* (2013.01); *H01L 29/0615* (2013.01); *H01L 29/1095* (2013.01); *H01L 29/66712* (2013.01); *H01L 29/861* (2013.01); *H01H 2300/018* (2013.01)

(58) Field of Classification Search
CPC ............ H01L 29/7804; H01L 29/1095; H01L 29/0615; H01L 29/861
See application file for complete search history.

(56) References Cited

U.S. PATENT DOCUMENTS

| | | | |
|---|---|---|---|
| 2010/0025748 A1* | 2/2010 | Mauder ............ | H01L 21/26513 257/296 |
| 2014/0015007 A1* | 1/2014 | Werber .............. | H01L 29/0615 257/142 |

FOREIGN PATENT DOCUMENTS

DE    102008056574 A1    6/2009

* cited by examiner

*Primary Examiner* — Dung A. Le
(74) *Attorney, Agent, or Firm* — Murphy, Bilak & Homiller, PLLC

(57) ABSTRACT

A charge-compensation semiconductor device includes a source metallization spaced apart from a gate metallization, and a semiconductor body including opposing first and second sides, a drift region, a plurality of body regions adjacent the first side and each forming a respective first pn-junction with the drift region, and a plurality of compensation regions arranged between the second side and the body regions. Each compensation region forms a respective further pn-junction with the drift region. A plurality of gate electrodes in Ohmic connection with the gate metallization is arranged adjacent the first side and separated from the body regions and the drift region by a dielectric region. A resistive current path is formed between one of the gate electrodes and a first one of the compensation regions, or between the first one of the compensation regions and a further metallization spaced apart from the source metallization and the gate metallization.

20 Claims, 17 Drawing Sheets

(51) Int. Cl.
*H01L 29/66* (2006.01)
*H01L 29/861* (2006.01)

701

702

703 ated switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, a low on-state resistance Ron and high breakdown voltages $U_{bd}$ are often desired.

CHARGE-COMPENSATION SEMICONDUCTOR DEVICE AND A MANUFACTURING METHOD THEREFOR

TECHNICAL FIELD

Embodiments of the present invention relate to charge-compensation semiconductor devices, in particular to vertical power charge-compensation semiconductor transistors and manufacturing methods therefor.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, a low on-state resistance Ron and high breakdown voltages $U_{bd}$ are often desired.

To achieve low on-state resistance Ron and high breakdown voltages $U_{bd}$, charge-compensation semiconductor devices were developed. The compensation principle is based on a mutual compensation of charges in n- and p-doped regions, which may be implemented as n- and p-doped pillar regions or wall-shaped regions, in the drift zone of a vertical MOSFET.

Typically, the charge-compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a (current-carrying) active area A. The reduction of the on-state resistance Ron times the active chip area A, in the following also referred to as (area) specific on-state resistance Ron*A, of such semiconductor power devices is associated with a reduction of the heat generated by the current in the on-state, so that such semiconductor power devices with charge-compensation structure remain "cool" compared with conventional semiconductor power devices.

However, the specific on-state resistance Ron*A of charge-compensation semiconductor devices may only decrease with lowering pitch of the compensation regions up to a limit and even increase when the pitch is further lowered.

Accordingly, there is a need to improve charge-compensation semiconductor devices and manufacturing of those semiconductor devices.

SUMMARY

According to an embodiment of a charge-compensation semiconductor device, the charge-compensation semiconductor device includes a gate metallization and a semiconductor body including a first side, a second side opposite the first side, and a drift region arranged between the second side and the first side. A source metallization is arranged on the first side. In a vertical cross-section perpendicular to the first side the charge-compensation semiconductor device includes two body regions arranged in the semiconductor body adjacent to the first side, each of the two body regions forming a first pn-junction with the drift region, a source region arranged in the semiconductor body and between the first side and one of the two body regions, in Ohmic connection with the source metallization, and forming a second pn-junction with the one of the two body regions, a gate electrode in Ohmic connection with the gate metallization, the gate electrode being arranged adjacent to the first side and separated from the source region, the one of the two body regions and the drift region by a dielectric region, and two compensation regions each forming a respective further pn-junction with the drift region. Each of the two compensation regions is arranged between the second side and one of the body regions. An Ohmic connection is formed between a first compensation region of the two compensation regions and the gate metallization or between the first compensation regions and a further metallization which is neither connected with the source metallization nor with the gate metallization.

According to an embodiment of a charge-compensation semiconductor device, the charge-compensation semiconductor device includes a gate metallization, a source metallization spaced apart from the gate metallization and a semiconductor body. The semiconductor body includes a first side, a second side opposite the first side, a drift region arranged between the second side and the first side, several body regions arranged in the semiconductor body adjacent to the first side, each of the body regions forming a respective first pn-junction with the drift region, and several compensation regions each forming a respective further pn-junction with the drift region. Each of the compensation regions is arranged between the second side and the body regions. Several gate electrodes in Ohmic connection with the gate metallization are arranged adjacent to the first side and separated from the body regions and the drift region by a dielectric region. A resistive current path is formed between one of the compensation regions and one of the gate electrodes or between the one of the compensation regions and a further metallization spaced apart from the source metallization and the gate metallization.

According to an embodiment of a method for forming a charge-compensation semiconductor device, the method includes providing a semiconductor body having a first side and a second side opposite the first side, and including a drift region, several body regions each forming a respective first pn-junction with the drift region, and several compensation regions each forming a respective further pn-junction with the drift region, each of the compensation regions being arranged between the second side and an adjacent one of the body regions, and forming several gate electrodes adjacent to the first side, and separated from the body regions and the drift region by a dielectric region so that a resistive current path is formed between one of the gate electrodes and one of the compensation regions.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis is placed upon illustrating the principles of the invention. Moreover, in the figures, like reference numerals designate corresponding parts. In the drawings.

DETAILED DESCRIPTION

Figure 1:
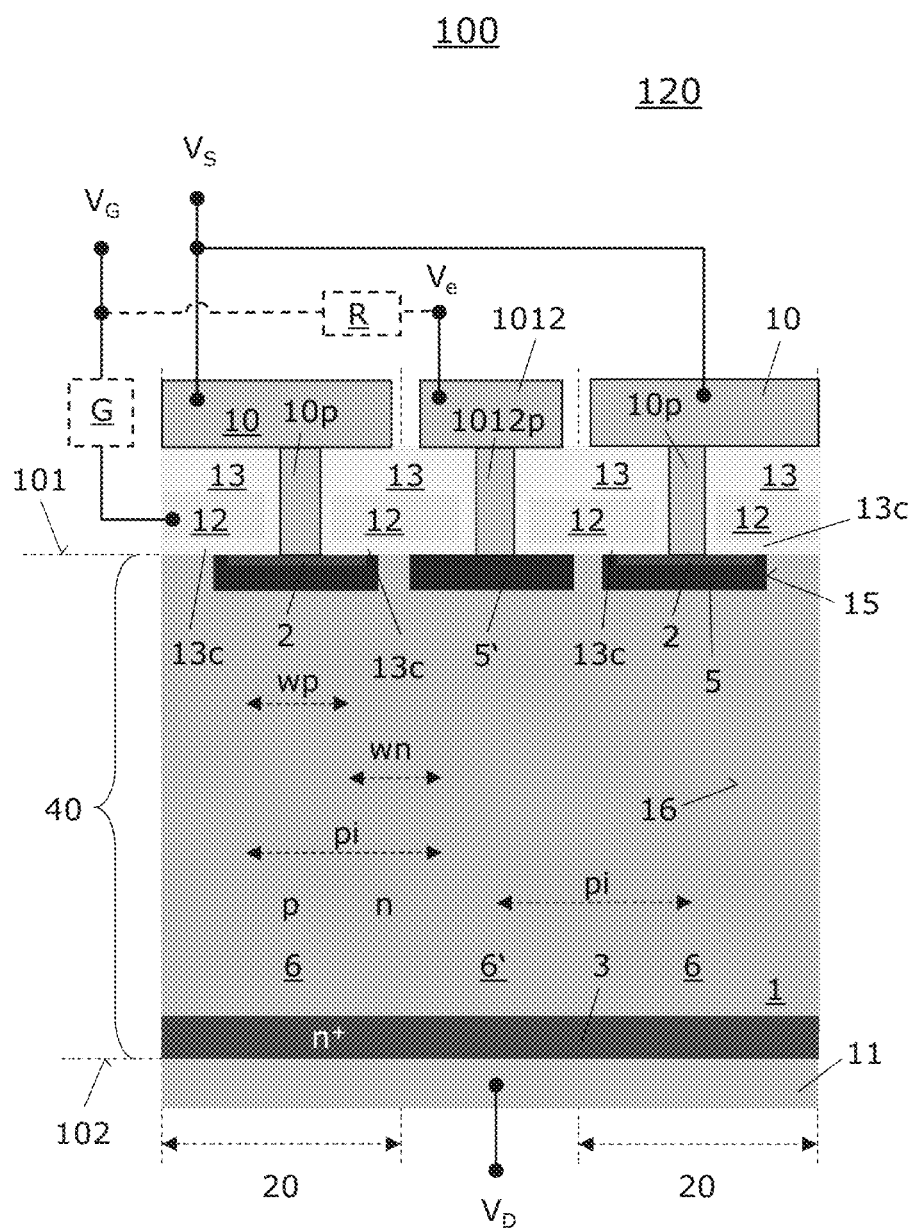
FIG. 1 illustrates a vertical cross-section through a charge-compensation semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body, typically a respective substantially flat surface. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a drain metallization arranged on the first surface and a source metallization and an insulated gate electrode arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The to "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V. Within this specification the terms "power semiconductor device" and "power semiconductor component" are used synonymously.

The term "edge-termination structure" as used in this specification intends to describe a structure that is configured to provide in a blocking mode a transition region in which a high electric voltage, i.e. a voltage of high absolute value compared to ground, such as a drain voltage around an active area of the semiconductor device changes gradually to the potential at or close to the edge of the device and/or to a reference potential such as ground, source- or gate potential. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are typically in low Ohmic connection with a drain electrode (drain metallization). The source region is typically in low Ohmic connection with a source electrode (source metallization).

In the context of the present specification, the term "metallization" intends to describe a region or a layer with metallic or near metallic properties with respect to electric conductivity. Accordingly, a metallization may form an equipotential region during device operation. A metallization may be in contact with a semiconductor region to form an electrode, a lead, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, $PtSi$, $WSi_2$. $MoSi$, or an electrically conductive carbide such as AlC, NiC, MoC, TiC, PtC, WC or the like. The metallization may also include different electrically conductive materials, for example a stack of those materials.

In the context of the present specification, the term "in Ohmic connection" intends to describe that there is an Ohmic current path, e.g, a low-Ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact" intends to describe that two elements or portions of a semiconductor device are in direct mechanical (intimate physical) contact and in Ohmic connection.

The terms "electrical connection" and "electrically connected" intend to describe an Ohmic connection between two features.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e. g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the ter "field electrode" intends to describe an electrode which is arranged next to a semiconductor region, typically the drift region, partially insulated from the semiconductor region. The field electrode may be configured to expand a depleted portion in the semiconductor region by charging to an appropriate voltage, typically a negative voltage with regard to the surrounding semiconductor region for an n-type semiconductor region.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s) and space charge zone(s), typically a contiguous depleted zone whereby the current flow between two electrodes or metallizations connected to the semiconductor body can be prevented.

The term "pn-junction" as used in this specification intends to describe the boundary surface between adjoining semiconductor regions or semiconductor portions of different conductivity type.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of charge-compensation semiconductor device 100 is explained. FIG. 1 illustrates a vertical cross-section through a semiconductor body 40 of the semiconductor device 100. The semiconductor body 40 extends between a first side, typically a flat first surface 101, facing a vertical direction, and second side, typically a flat second surface (back surface) 102 arranged opposite to the first surface 101.

The semiconductor body 40 includes a mono-crystalline drift region 1 of a semiconductor material, such as silicon, doped with first dopants (dopants of a first conductivity type) typically providing a first number of first free charge carriers per unit in the semiconductor material. In the exemplary embodiment, the drift region 1 is n-type, i.e. doped with n-type dopants. For example, the semiconductor material may be silicon and the n-type dopants may be electrically active phosphorous or arsenic impurities providing one free electron per unit.

The semiconductor body 40 typically includes a bulk mono-crystalline substrate 3 of the semiconductor material at the second surface 102 and at least one layer, typically at least one epitaxial layer 1 of the same semiconductor material formed thereon and extending to the first surface 101. Using the epitaxial layer(s) provides more freedom in tailoring the background doping of the material since the doping concentration can be adjusted during deposition of the epitaxial layer or layers.

A drain metallization 11 in Ohmic connection with the drift region 1 is arranged on the second side 102. As illustrated in FIG. 1, the drain metallization 11 may substantially or completely cover the second side 102.

A drain region 3 arranged between the drift region 1 and the drain metallization may extend to the second side 102 and is typically in Ohmic contact with drain metallization 11.

FIG. 1 shows three p-type body regions 5, 5' arranged in the semiconductor body 40 at the first side 101. Each of the body regions 5, 5' forms a first pn-junction 15 with the drift region 1.

Although the body regions 5, 5' are separated from each other in the shown vertical cross-section, the two outer body regions 5 may be contiguous.

However, the illustrated body regions 5, 5' are typically implemented as separate body regions 5, 5', e.g. substantially stripe-shape when seen from above, at least in the illustrated active area 120.

In the active area 120, a plurality of gate electrodes 12 is arranged next to the first side 101 and electrically insulated from the semiconductor body 40 by respective gate dielectric regions 13c of a dielectric layer 13. Accordingly, respective operable switchable channel regions may be formed in the (active) body regions 5 for providing, in a forward mode of the field-effect semiconductor device 100, low Ohmic connections between the source metallization 10 and the drift region 1, and thus between the source metallization 10 and the drain metallization 11 in the illustrated exemplary embodiment of vertical an n-channel MOSFET 100.

In embodiments referring to p-channel MOSFETs, the doping relations are reversed.

As illustrated in FIG. 1, typically highly n-doped source regions 2 in Ohmic connection with the source metallization 10 typically arranged at the first side 101 may be arranged between some of the body regions 5 and the first side 101. The source regions 2 form with the respective body region 5 a second pn-junction which is spaced apart from the first pn-junction(s).

The gate electrodes 12 and the switchable channel regions may define the active area 120. The active area 120 may also be defined by the presence of source regions 2 and/or by the presence of active cells 20, e.g. MOSFET-cells, for carrying a load current between the source metallization 10 and the drain metallization 11. Typically, FIG. 1 corresponds to a (small) section of an active area with a plurality of MOSFET-cells 20.

Further, the active area 120 is typically surrounded by a peripheral area (not shown in FIG. 1) when seen from above.

The gate electrodes 12 are in low in Ohmic connection with a gate metallization G typically also arranged on the first side 101. The gate metallization G typically forming a gate pad may be formed in another cross-section and/or outside the section illustrated in FIG. 1. Therefore, the gate metallization G is only shown as a dashed rectangle in FIG. 1.

In the exemplary embodiment, the gate electrodes 12 are arranged on the first side 101.

As illustrated in FIG. 1, the source regions 2 may be in Ohmic connection with the source metallisation 10 via source contacts 10p that may be implemented as shallow trench contacts formed through the dielectric layer 13 arranged at the first side 101, and between the first side 101 and the source metallisation 10. The source contacts 10c may e.g. be formed as doped poly-silicon regions. In other embodiments, the source contacts 10p may extend through the first side 101 and into a respective source region 2 or even into the adjoining body region 5.

In the exemplary embodiment, three p-type compensation regions 6, 6' are arranged between the second side 102 and one of the body regions 5, 5'. Each compensation regions 6, 6' forms a respective further pn-junction 16 with the drift region 1 and extends to a one of the body regions 5, 5'. In the following, the pn-junctions 16 are also referred to as third pn-junctions.

As illustrated in FIG. 1, the compensation regions 6, 6' are, in the vertical cross-section, typically at least substantially centered (in particular, have a common central vertical axis) with respect to the adjoining body region 5, 5'.

While the outer compensation regions 6 in FIG. 1 adjoin a respective active body region 5, in which a respective channel region may be formed, the central compensation regions 6' adjoins an inactive body region 5' without a source region in the exemplary embodiment.

In the exemplary embodiment, the inactive body region 5' and a shallow trench contact 1012p (of e.g. doped poly-Si) provide a low Ohmic connection between the compensation region 6' and a further metallization 1012 which is arranged on the first side 101, and spaced apart from the source metallization 10 and the gate metallization G (and the drain metallization 11). The further metallization 1012 is typically not in a low Ohmic connection with the gate metallization G, more typically not in a resistive connection of less than 50 Ohm or 75 Ohm. A resistance between the further metallization and the gate metallization G may even be larger than 1 MOhm ($10^6$ Ohms).

Accordingly, the compensation region 6' may be, at least in a first forward mode, in which inversion channels are formed in the active body regions 5 and between the source regions 2 and the drift region 1, substantially at a first voltage Ve, that may for example be (directly) applied to the further metallization 1012 as illustrated in FIG. 1, which differs from the source voltage Vs (typically ground) applied to the source metallization 10, the gate voltage $V_G$ applied to gate metallization G and the drain voltage $V_D$ applied to the drain metallization 11.

For an n-channel MOSFET, the first voltage Ve is typically larger than the source voltage Vs and lower than the gate voltage $V_G$ (Vs<Ve<$V_G$) but may even reach the gate voltage $V_G$. The first voltage Ve is typically larger than Vs+0.05*Vth, more typically in a range from Vs+0.1*Vth and 0.9*$V_G$, and even more typically in a range from Vs+0.8*Vth and 0.8*$V_G$, wherein Vth denotes threshold voltage of the first pn-junction 15 and the body diode at room temperature, respectively (for silicon about 0.7 V at room temperature, and e.g. about 0.4 V at 125° C.) As explained below in more detail, applying the first voltage Ve to the compensation region 6' allows lower specific on-state resistance Ron*A of the semiconductor devices 100 compared to similar semiconductor devices only having compensation region connected to the source metallization, in particular for low distances wn between adjacent compensation regions 6, 6' and low pitches pi of the compensation regions 6, 6', respectively (pi=wp+wn, wherein wp refers to the horizontal width of the compensation regions 6, 6' in the vertical cross-section).

The term "pitch" as used within this specification intends to describe a distance between repeated elements in a structure possessing translational symmetry and typically corresponds to length of a primitive axis (vector) of the structure and length of a base vector of a regular lattice, respectively.

In one embodiment, the further metallization 1012 also forms a pad. Accordingly, the semiconductor device 100 is implemented as a four terminal device and the first voltage Ve may be applied as an external voltage.

As illustrated in FIG. 1 by the dashed resistor R and the dashed wiring, the semiconductor device 100 may alternatively be implemented as a three-terminal device. In these embodiments, the further metallization 1012 (and thus the compensation regions 6') may be connected to the gate metallization via the resistor R. The resistor R ensures that the first voltage Ve is in the desired range (Vs<Ve<$V_G$) during the first forward mode. Accordingly, the resistor R may operate as a series resistor.

The resistor R may be hardwired on the first side 101 and on the metallizations 10, 1012 and G, respectively, i.e. as an external resistor.

Alternatively, the resistor may be formed by resistive current path, in particular by a strip conductor of e.g, appropriately (depending on geometry) doped poly-silicon arranged below the metallizations 10, 1012 and G, for example on and/or below the first side 101. This is explained below, in particular with regard to FIG. 11 to FIG. 14B.

To reduce any leakage current to a desired low level, the resistance of the resistor R is typically at least about 100 Ohm, more typically at least about 1 k Ohm, even more typically at least about 2 k Ohm, for example 4 k Ohm+/−1 k Ohm for a device with an active area of 1 mm². If not stated otherwise, the absolute resistance values of the resistor R (and a resistive current path) which are given in the below description also refer to an active device area of 1 mm².

On the other hand, the resistance of the resistor R is typically less than about 100 k Ohm, more typically less than about 20 k Ohm or 10 k Ohm, even more typically less than about 6 k Ohm. Otherwise, the first voltage Ve may become too close to the source voltage Vs for a significant benefit with regard to Ron*A.

Compared to similar semiconductor devices with compensation region connected to the source metallization, the semiconductor device 100 may have higher switching losses, in particular during switching-off (due to the fact that the resistance is typically increased in this phase) and for fast switching-on. The latter is a due to the fact that the compensation region 6' is discharged during switching-on via the resistor R. For example, assuming that all compensation regions 6' of a typical 600 V compensation semiconductor device with an active area of 1 mm² are charged via a 20 k Ohm—resistor R with a total charge of 20 nC during switching-on with a gate voltage Vg ($V_{GS}$=$V_G$-$V_S$=$V_G$) results in a discharge time t of t=20 nC/(10V/20 kOhm)=20 nC/0.5 mA=40 μs.

Therefore, the semiconductor device 100 may particularly be used as switch in circuitries in which the switching losses are of minor importance, in particular as a static transfer switch, i.e. as an electrical switch that switches a load between two sources.

According to a further embodiment, the semiconductor device 100 further includes a switch (not shown in FIG. 1) allowing switching between the dashed current path connecting the further metallization 1012 via the resistor R to the gate metallization G to an alternative current path connecting the further metallization 1012 in a low Ohmic manner to the source metallization 10. Accordingly, switching losses are reduced. Such a semiconductor device 100 may also be used in applications in which also fast switching periods occur, such as in switch mode power supplies (SMPS).

Figure 2:
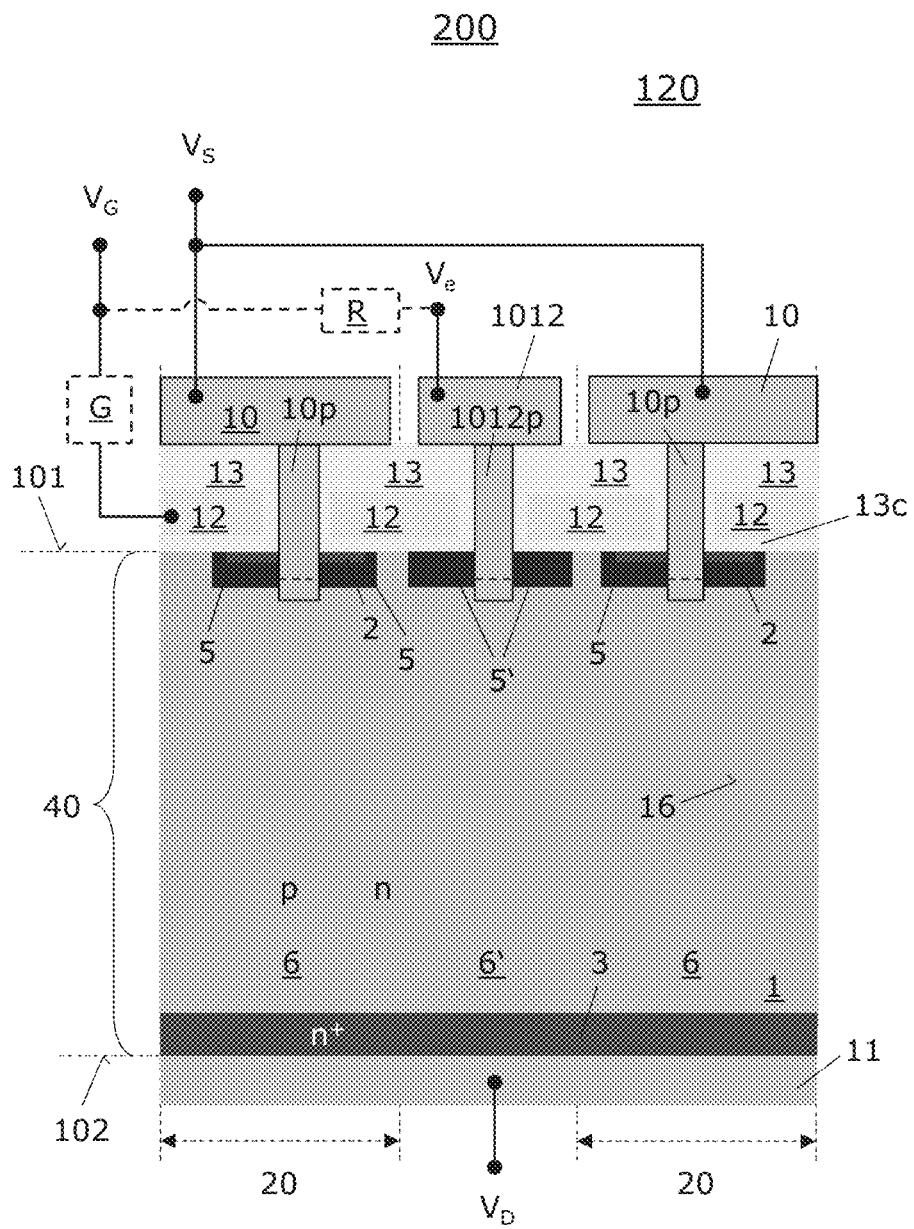
FIG. 2 illustrates a vertical cross-section through a charge-compensation semiconductor device according to an embodiment.

Furthermore, the switching losses may be reduced if some of the compensation regions 6 are connected to the source metallization 10 as illustrated for the semiconductor device 200 shown in FIG. 2.

In the following, the compensation regions 6' which are in Ohmic connection with the gate metallization G or the further metallization 1012 are referred to as first compensation regions 6' and the compensation regions 6 which are floating or more typically in (low) Ohmic connection with the source metallization 10 are referred to as second compensation regions 6.

According to an embodiment, the doping concentrations of the compensation regions 6, 6' and the portions of the drift region (drift portions) 1 alternating with the compensation regions 6, 6' are chosen such that, in the off-state, their charges can be mutually depleted and that, in the on-state, an uninterrupted, low-resistive conduction path is formed from the source metallization 10 to the drain metallization 11.

A total number of free electrons provided by n-type dopants typically substantially matches a total number of free holes provided by p-type dopants at least in the active area 120. Typically, the total number of free electrons provided by the n-type dopants varies by less than 5%, more typically less than 1% from the total number of free holes provided by the p-type dopants. Accordingly, the drift portions 1 and the first compensation regions 6 form a pn-compensation structure 1, 6, 6'.

As illustrated in FIG. 2 for the charge-compensation semiconductor device 200, which is similar to the charge-compensation semiconductor device 100 explained above with regard to FIG. 1, some of the compensation regions 6, namely the second compensation regions 6 may be in low Ohmic connection with the source metallisation 10.

For example, the source contacts 10p may extend through the respective source region 2 into the adjoining active body region 5 (see dashed lines in the contacts 10p, 1012p) and even into the respective second compensation region 6. In the latter case, the source contacts 10p divide the respective body region 5, in the shown vertical cross-section, into two portions which may are, however, be contiguous (when seen from above).

Further, higher p-doped body contact regions (not shown) may be arranged between the source contacts 10p and the body regions 5 and between the source metallization 10 and the body regions, respectively.

Contacting the active body regions 5 to the source metallisation 10 ensures high latch-up stability of the semiconductor device 200. Furthermore, switching losses may be reduced due to contacting the second compensation regions 6 to the source metallisation 10.

Likewise, the shallow trench contact 1012p may extend through the first side 101 into inactive body region 5' and even into the first compensation region 6'.

The first and second compensation regions 6, 6' may alternate and form a regular lattice, respectively. For example, each second or third compensation region may be a second compensation region 6.

Typically, at least half of the compensation regions are first compensation regions 6'.

Figure 3:
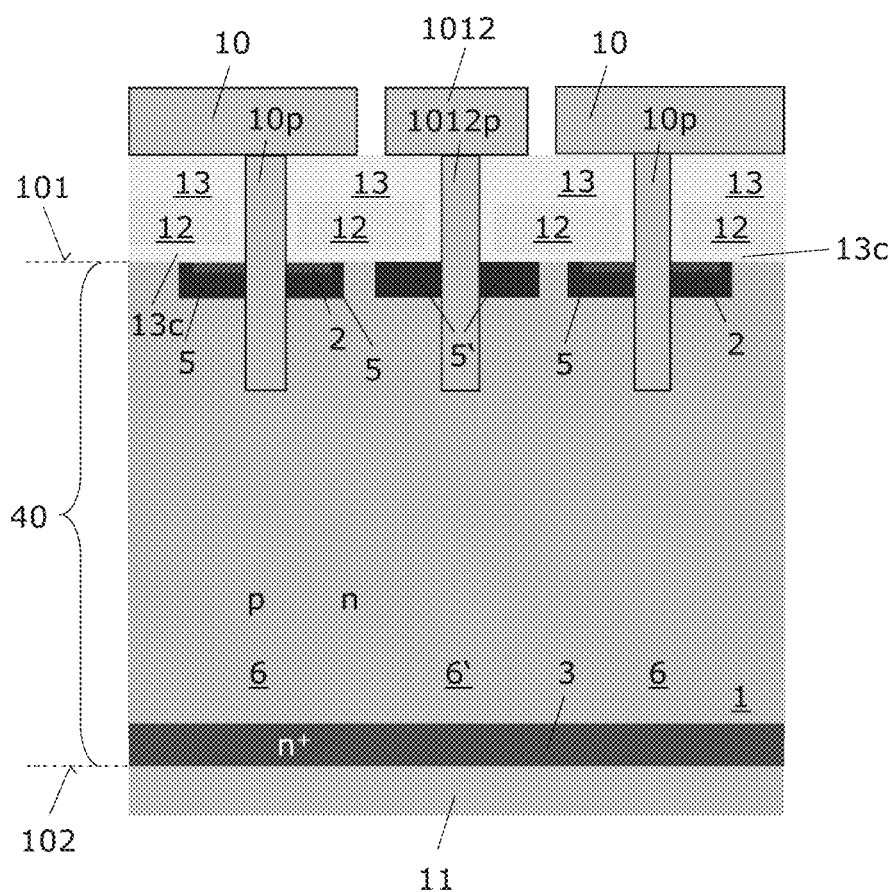
FIG. 3 illustrates a vertical cross-section through charge-compensation semiconductor device according to an embodiment.

FIG. 3 illustrates a vertical cross-section through a semiconductor body 40 of a charge-compensation semiconductor device 300. The charge-compensation semiconductor device 300 is similar to the semiconductor device 200 explained above with regard to FIG. 2, and is also implemented as charge-compensation MOSFET.

However, the first and second compensation regions 6, 6' do not adjoin a body region 5, 5' but are spaced apart from the closest body region 5, 5' by an upper portion of the drift region 1.

The distance between the compensation region 6, 6' and the closest body region 5, 5' may be in a range from about 0.5 μm to about 2 μm.

For sake of clarity, any external wiring shown in FIGS. 1 and 2 is not shown in FIG. 3.

Figure 4:
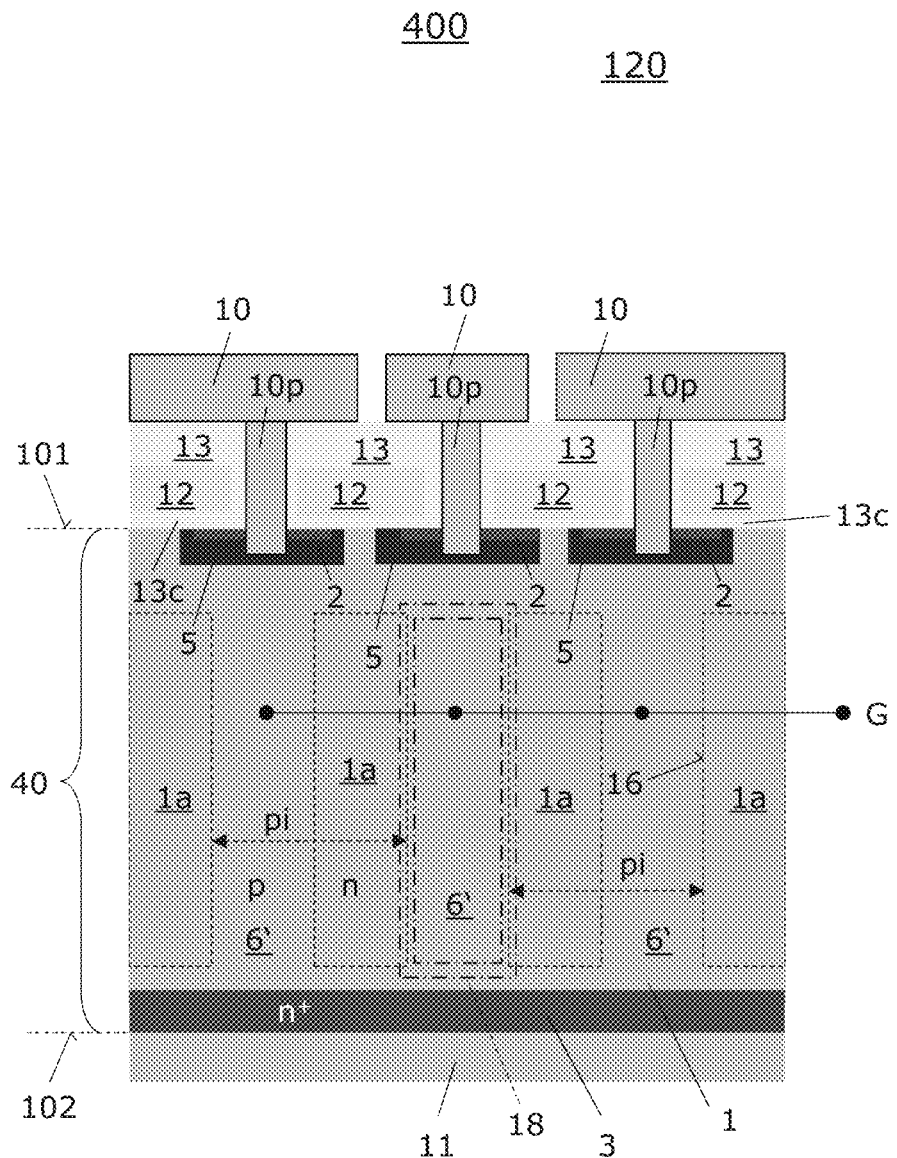
FIG. 4 illustrates a vertical cross-section through charge-compensation semiconductor device according to an embodiment.

FIG. 4 illustrates a vertical cross-section through a semiconductor body 40 of a charge-compensation semiconductor device 400. The charge-compensation semiconductor device 400 is similar to the semiconductor device 300 explained above with regard to FIG. 3, and is also implemented as charge-compensation MOSFET.

However, all compensation regions 6' are in low Ohmic connection with the gate metallisation G. For sake of clarity, details of the Ohmic connections between the compensation regions 6' are omitted in FIG. 4. For example, the compensation regions 6' may be connected with each other via p-type portions in another vertical cross-section.

Further, each compensation region 6' is spaced apart from and arranged below closest active body region 5.

The distance between the compensation regions 6, 6' and the closest body region 5 may be chosen as explained above with regard to FIG. 3.

Typically, a plurality, e.g. more than ten, of alternating n-type drift portions 1a and p-type compensation regions 6, 6' are arranged in the active area 120.

In the vertical cross-section, the p-type compensation regions 6, 6' may be formed as vertically orientated pillars, substantially vertically orientated strip-type parallelepipeds, rectangles (walls) or ellipsoids.

In the following, the n-type drift portions 1a are also referred to as n-type wall regions 1a and first wall regions 1a (of the first conductivity type), respectively, and the p-type compensation regions 6, 6' are also referred to as p-type wall regions 6, 6' and second wall regions 6, 6' (of the second conductivity type), respectively.

The p-type compensation regions 6, 6' may e.g. be formed in vertical trenches by selective epitaxial deposition.

Typically, the doping level of the drift portions 1a (and the compensation regions 6, 6') can be increased proportionally to the inverse pitch (n~1/pi) if the pitch pi is reduced. Thus, the conductivity of a single drift portion 1a remains approximately constant with decreasing pitch pi, and the area-specific switch-on resistance Ron*A decreases with the pitch pi. The charge Q which can be removed by a pn-junction 16 (removable charge) remains constant in a first approximation: If the maximum field strength (breakdown field strength $E_{BR}$) is regarded as constant, the maximum extent of the space charge zone is inversely proportional to the doping. However, the breakdown field strength $E_{BR}$ increases with increasing doping n due to the decreasing carrier mobility, and accordingly also the breakdown charge $Qbr=Q(E_{BR})$. For example, the breakdown charge Qbr for silicon is about $1e12/cm^2$ at a doping of $1e13\ cm^3$, about $2e12/cm^2$ at $1e15/cm^3$, and about $3.5*e12/cm^2$ at $1e17/cm^3$.

In silicon, a potential difference of about 0.7 V is formed at room temperature without applying an external voltage at the pn-junction 16. This voltage difference is connected to the formation of a space charge zone 18. For sake of clarity, only one space charge zone 18 is shown in FIG. 4. The space charge zones 18 may limit the downscaling of the semiconductor device.

Figure 5:
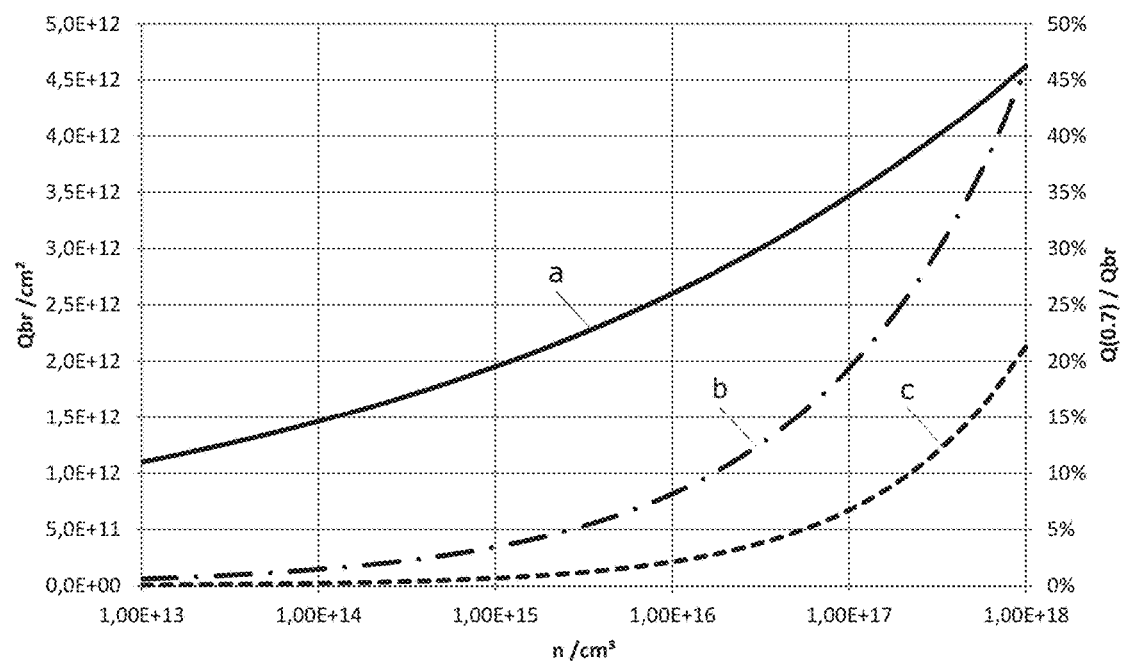
FIG. 5 illustrates a relationship between the breakdown charge and the doping level of charge-compensation semiconductor devices.

Curve a of FIG. 5 shows in the calculated relationship between the breakdown charge Qbr and the n-doping level of the n-type Si-drift portions. Curve c refers to the charge that is removed from the Si-drift portion if a voltage of 0.7 V drops across the pn-junction 16. Curve b represents the ratio between curve a and curve c in %. Accordingly, the fraction of the breakdown charge Qbr that is removed by the threshold voltage of 0.7 V increases with the doping level n. As a result, the remaining fraction available for the current transport reduces with the doping level n.

At a doping level of the order of $1e17/cm^3$ this may result in a deterioration of Ron*A, if all compensation regions are connected to the source potential (source metallization. Assuming a typical drain voltage of 1 V during device operation in forward mode, the potential difference between compensation regions and the drift portions near the drain is increased by 1 V to 1.7 V—in these devices. This may massively further reduce the fraction of the breakdown charge Qbr available for the current transport.

These effects are at least reduced when one or more of the compensation regions 6' are connected to a potential above the source voltage, for example connected via a resistor to the gate voltage.

Typically, the resistance of the resistor may be chosen such that the compensation regions 6' are close to the source voltage plus the threshold voltage of the body diode.

Figure 6:
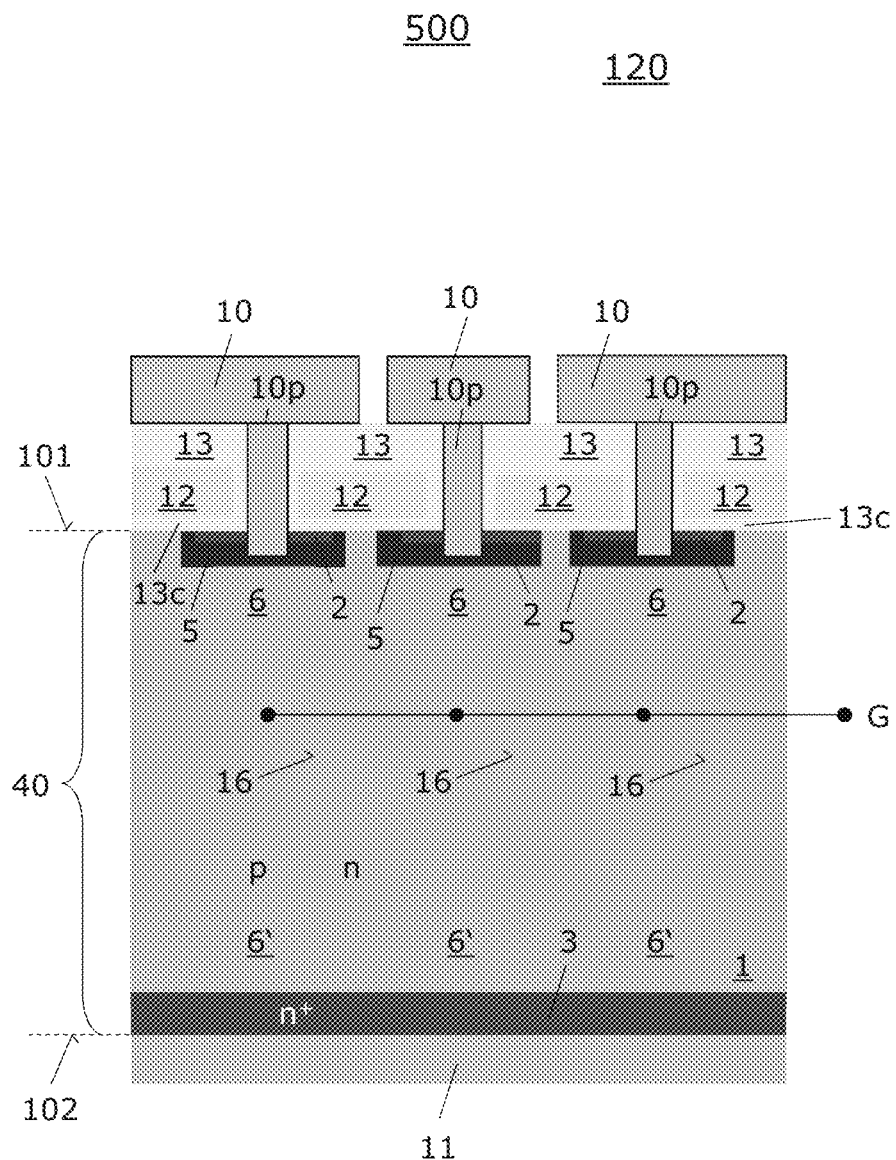
FIG. 6 illustrates a vertical cross-section through a charge-compensation semiconductor device according to an embodiment.

FIG. 6 illustrates a vertical cross-section through a semiconductor body 40 of a charge-compensation semiconductor device 500. The charge-compensation semiconductor device 500 is similar to the semiconductor device 400 explained above with regard to FIG. 4, and is also implemented as charge-compensation MOSFET.

However, each of the compensation regions 6, 6' of the charge-compensation semiconductor device 500 has an upper portion 6 in Ohmic connection with the source metallization 10 and a lower portion 6' which is spaced apart from the upper portion 6 by a portion of the drift region 1.

The vertical distance between the upper and lower portions may be in a range from about 0.5 µm to about 2 µm.

Figure 7:
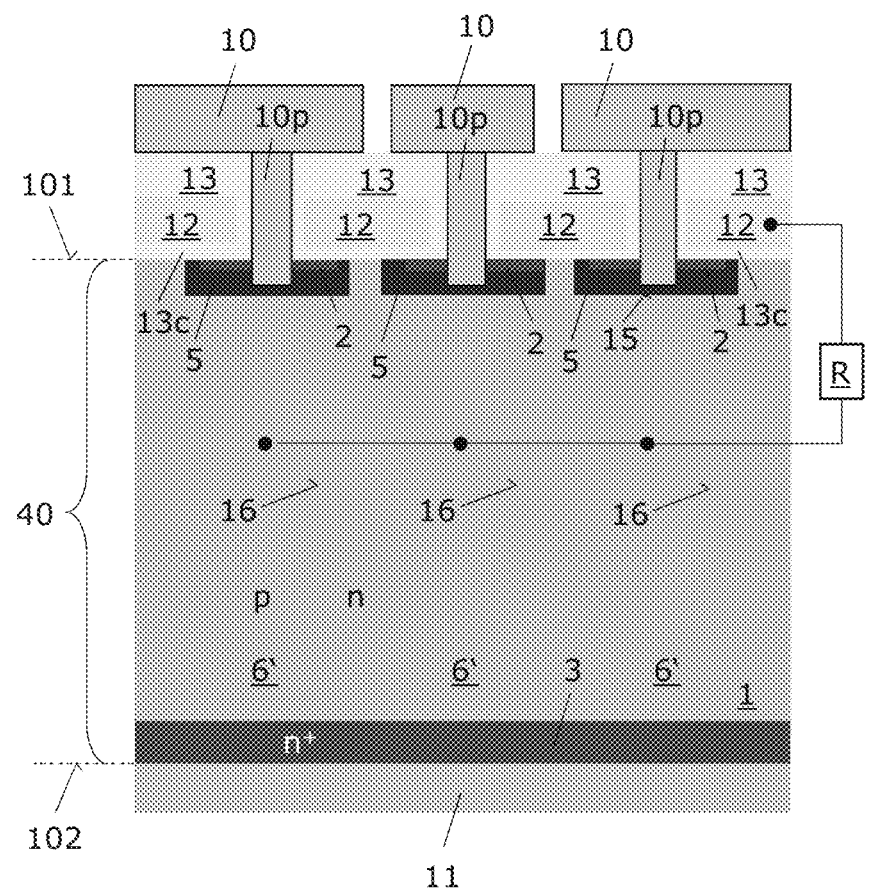
FIG. 7 illustrates a vertical cross-section through a charge-compensation semiconductor device according to an embodiment.

FIG. 7 illustrates a vertical cross-section through a semiconductor body 40 of a charge-compensation semiconductor device 600. The charge-compensation semiconductor device 600 is similar to the semiconductor device 400 explained above with regard to FIG. 4, and is also implemented as charge-compensation MOSFET.

However, the resistor R is formed between a gate electrode 12 and a closest one of the first compensation regions 6', typically as a resistive current path, more typically substantially as strip conductor running substantially parallel to the first side 101.

If the first compensation regions 6' are connected to the gate electrode 12 via a resistor R, a small current may flow from the gate electrode 12 into the first compensation regions 6' and via the pn-junction(s) 16 into the drift region 1.

If the resistance of R is high, the additional gate current will generate a high voltage drop across the resistor. Accordingly, the compensation potential may not increase appreciably. If the resistance of R is very small, the compensation potential at room temperature rises to about 0.7 V (in Si). Further, the leakage current (Ohmic losses) may be too high for very small resistances of R.

Figure 8:
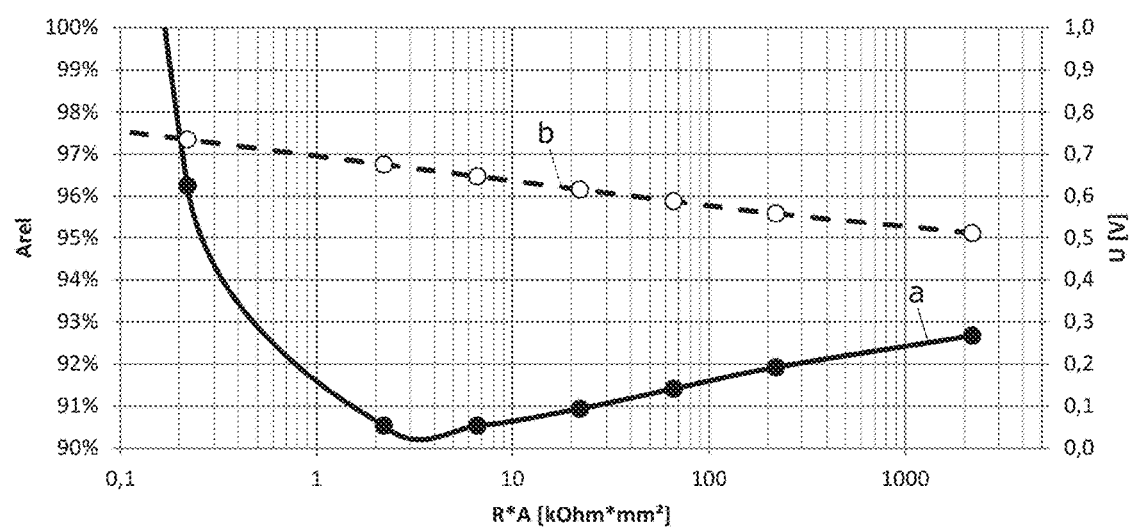
FIG. 8 illustrates a calculated surface-gain of charge-compensation semiconductor devices according to an embodiment.

FIG. 8 illustrates a calculated surface-gain Arel in percent of charge-compensation semiconductor devices with first compensation regions 6' as explained herein. Curve a shows the possible gain in active area Arel (with constant overall losses) compared to a charge-compensation semiconductor devices with compensation regions on source potential, Curve a was obtained for a gate voltage ($V_{GS}=V_G-V_S=V_G$) of 10 V and takes into account the achievable area gain by the decreased Ron*A. The additional losses due to the static gate current are also taken into account, more precisely by calculating and taking into account the additional area of the MOSFET required for dissipating the additional heat due to the additional (static) gate current without additional temperature increase. If the resistances (given as resistance R times the active area A in FIG. 8) are too small, losses are high due to the gate current. But with an appropriate resistance in a range of 4 k Ohm mm²+/−2 k Ohm mm², the active device area can be reduced by about 10%. In this resistance range, the gate losses are about 2%. It will be appreciated that the device could be operated in an even more favourable range when the gate voltage is lower.

The dashed curve b shows the potential of the compensation regions (at the contact) for drain-source voltage ($V_{DS}=V_D-V_S=V_D$) of 1 V.

Depending on device operation, the output charge $Q_{OSS}$, the output capacitance $C_{OSS}$ and the electric energy $E_{OSS}$, respectively, stored in the space charge region formed in the off-state and during reverse bias, respectively, mainly determine the switching losses. The stored charge $Q_{OSS}$ of semiconductor devices with charge compensation structures may be comparatively high. This may result in significant switching losses $E_{OSS}$. In addition to enable reverse blocking, the output charge $Q_{OSS}$ (at specific blocking voltage) has to be (completely) removed which results in switching delays.

In the following, passive losses $E_{pas}$ resulting from the first compensation regions 6' are estimated. The first compensation regions 6' are charged to their positive voltage starting from the drain-side end. This means that holes flow out of the first compensations regions 6' into a drift layer of the drift region 1 between the first compensation regions 6' and the body regions 5. When switched off, the holes resulting from Coss flow through the pn-junction 16 poled in the flux direction and through a space charge zone between first compensation regions 6' and the body regions 5. The voltage between first compensation regions 6' and the body regions 5 is defined by the punch voltage $U_P$ of the drift layer, which can be limited to small values.

According to an embodiment, the punch voltage $U_P$ is set to values of less than 0.7 V or even 0.5 V (the threshold voltage of the pn-junction 16), This may be achieved by an appropriate choice of the thickness and the doping level of the n-doped region between the first compensation region 6' and the body regions 5. Note that both reducing the distance and the doping level reduce the punch voltage. Accordingly, the potential of first compensations regions 6' in the forward mode is also limited by $U_P$, and the additional switching losses amount to about $U_P*Q_{OSS}$.

According to another embodiment, the punch voltage $U_P$ is set to values above the threshold voltage of the pn-junction 16. While this is advantageous for the forward mode, the switching losses increase in accordance with $U_P$.

For hard-switching applications, the increase of switching losses is however rather small compared to other losses. Epas is typically anyway low in hard switching applications. For resonant topologies, where the overall losses are mainly determined by Epas, the increase of switching losses may be of more importance. In hard switching topologies, the MOSFET is turned on (off) from (to) relatively high drain-source voltages $V_{DS}$, typically of at least about 100 V or even at least about 400 V, while in resonant topologies the device is turned on and/or off from (to) small drain-source voltages $V_{DS}$ of typically less than 10V.

Furthermore, switching losses may be significantly reduced when the charge-compensation semiconductor devices with the further metallization described herein are used in a circuitry further having a control circuit with a source input, a gate input, a control input, and a controlled output connected with the further metallization, wherein the control circuit is switchable via the control input between a first state and a second state. The source input and the controlled output are short circuited in the first state, and the gate input and the controlled output are short circuited in the second state or electrically connected with each other via a resistor having an electric resistance of at least 100 Ohm and typically at most 100 kOhm.

Figure 9:
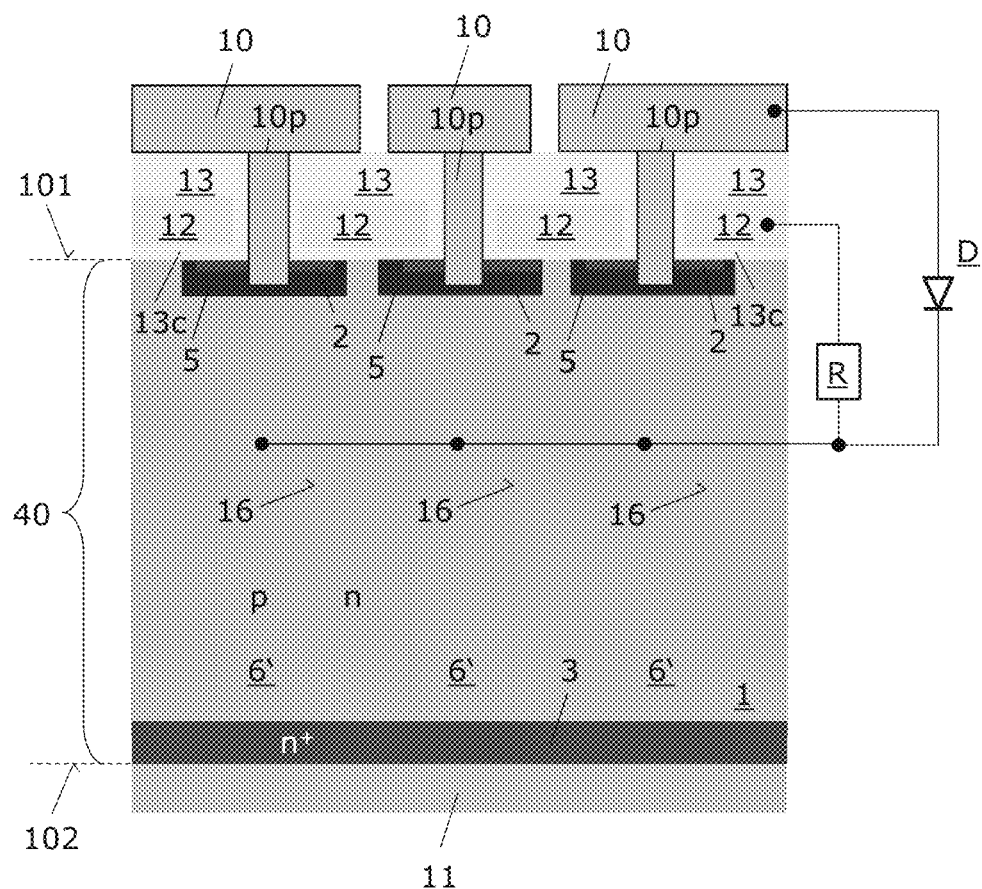
FIG. 9 illustrates a vertical cross-section through a charge-compensation semiconductor device according to an embodiment.

FIG. 9 illustrates a vertical cross-section through a semiconductor body 40 of a charge-compensation semiconductor device 601. The charge-compensation semiconductor device 601 is similar to the semiconductor device 600 explained above with regard to FIG. 7, and is also implemented as charge-compensation MOSFET.

However, the charge-compensation semiconductor device 601 further has a diode D directly connecting the source metallization 10 with the first compensation regions 6', typically a (poly-Si) pn-diode forming a rectifying current between the source metallization 10 and the first compensation regions 6'. Accordingly, the first compensation regions 6' may be discharged via the diode D during switching-off. Thus, the passive losses ($E_{pas}$) may be further reduced.

Figure 10:
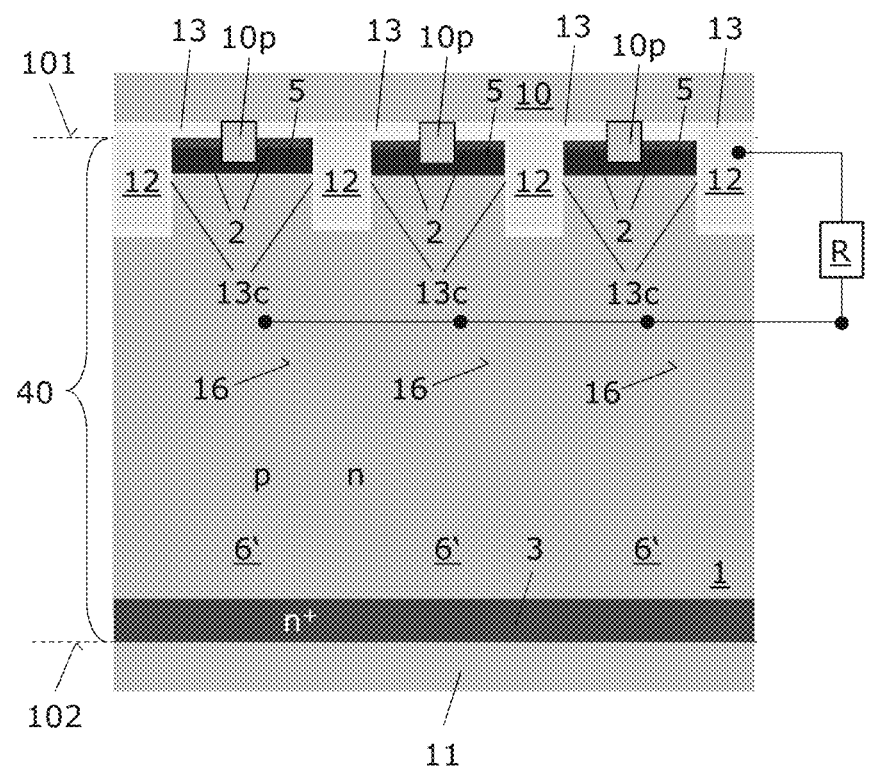
FIG. 10 illustrates a vertical cross-section through a charge-compensation semiconductor device according to an embodiment.

FIG. 10 illustrates a vertical cross-section through a semiconductor body 40 of a charge-compensation semiconductor device 602. The charge-compensation semiconductor device 602 is similar to the semiconductor device 600 explained above with regard to FIG. 7, and is also implemented as charge-compensation MOSFET.

However, the gate electrodes 12 are implemented as trench gate electrodes, i.e. as electrodes that are arranged in respective trenches extending from the first side 101 through a respective body region 5 into the drift region 1. Accordingly, the respective source regions 2 and the body regions 5 are, in the vertical cross-section, separated by the trench gate electrodes 12, 13 into respective portions.

Figure 11:
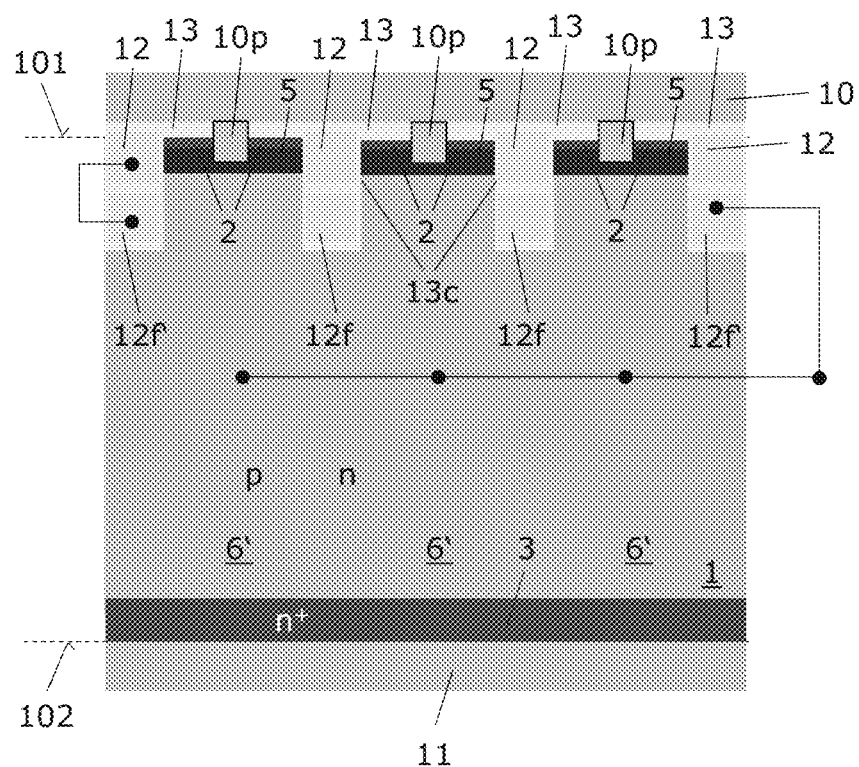
FIG. 11 illustrates a vertical cross-section through charge-compensation semiconductor device according to an embodiment.
Figure 12:
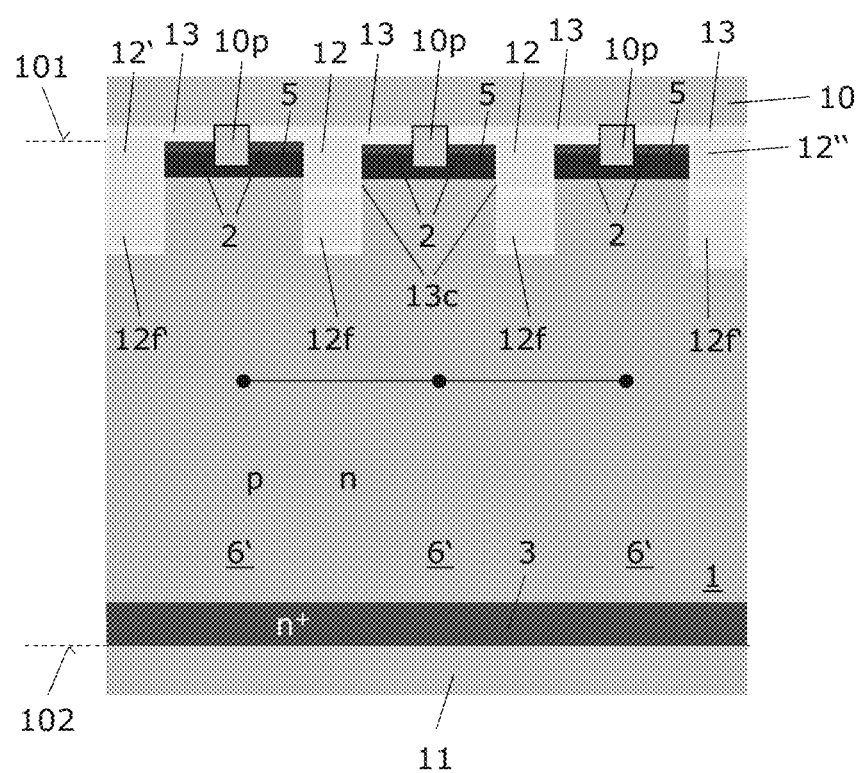
FIG. 12 illustrates another vertical cross-section through the charge-compensation semiconductor device illustrated in FIG. 11 according to an embodiment.

FIGS. 11 and 12 illustrate two typically parallel vertical cross-sections through a semiconductor body 40 of a charge-compensation semiconductor device 100. The charge-compensation semiconductor device 700 is similar to the semiconductor device 602 explained above with regard to FIG. 10, and is also implemented as charge-compensation MOSFET.

However, below each of the trench gate electrodes 12, 12', 12" a respective field electrode 12f, 12f' is arranged, typically in a respective common trench extending into the drift region 1, and separated from the drift region 1 by a field dielectric region. While the field electrodes 12f may (like the gate electrodes 12, 12', 12") form equipotential regions during device operation, typically at gate or source voltage, the field electrode 12f' is, forms a contiguous strip conductor (resistor, and therefore also formed below the left gate electrode 12"), adjoins the left gate electrode 12' and an extension portion of the right compensation region 6 in respective contact region. Accordingly, the resistor R shown in FIG. 10 is implemented as a strip resistor below the gate electrodes. In the following, the field electrodes 12f are also referred to as first field electrode and the field electrode 12f' is referred to as second field electrode 12f'.

Strictly speaking, the second field electrode 12f' is not a field electrode since it is not an equipotential region during device operation and may therefore be referred to as field resistor and trench field resistor. However, the shape and manufacturing is similar to normal (trench) field electrodes except for electric conductivity and doping level, respectively.

The second field electrode 12f' may also be formed by poly-Si. For example, the field electrode 12f may be formed by a silicon stripe or bar having an exemplary resistivity of 10 Ohm/square (in vertical direction) corresponding to 14 k Ohm per mm of its length in horizontal direction. Thus, the desired series resistor between the gate metallization and the compensation regions 6' may even be realized in one trench.

There may be more than one contact region between the gate electrode 12' and the field electrode 12f' and/or between the field electrode 12f' and the (left) compensation region 6'.

Forming the contact(s) between the field electrode 12f' and the (left) compensation regions 6' may include locally removing the field dielectric 13.

The contacts may be formed as vertical or lateral contacts.

In embodiments referring to wall- or strip-shaped compensating regions 6', it is possible to contact each compensation region 6' individually at one (or two) end portions.

Due to the temperature dependency of the resistivity of the field electrode 12f', the electric potential applied to the compensation regions 6' is automatically, and due to the short distance to the channel regions, quickly adjusted in accordance with the temperature of the semiconductor device in a desired way (higher electric potential for higher device temperatures). In particular, the highest possible electric potential may be applied to the compensation regions 6' in this way—even at high device temperatures.

Note that typically used gate-oxide stress tests can still be performed. Either the leak current flowing from the gate to the drain due to the series resistor is taken into account, or a voltage is applied to the drain which is higher than that applied to the gate to suppress the leakage current.

Figure 13A:
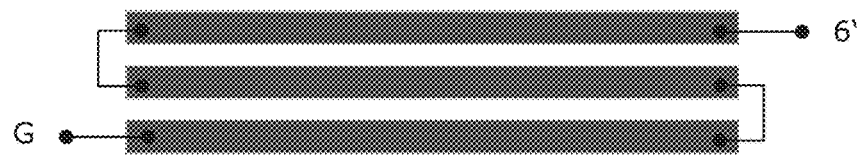
FIG. 13A illustrates a layout of a resistor of a charge-compensation semiconductor device according to an embodiment.
Figure 13B:
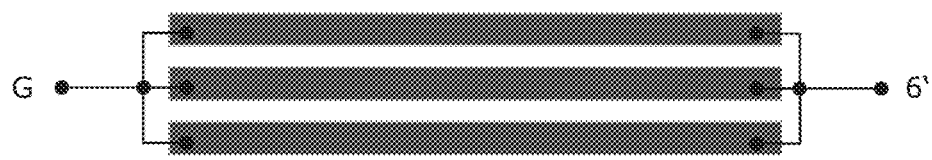
FIG. 13B illustrates a layout of a resistor of a charge-compensation semiconductor device according to an embodiment.

FIG. 13A and FIG. 13B illustrates exemplary layouts of series resistors R, 12f' of charge-compensation semiconductor devices 701, 702 which may be similar to the semiconductor device 700 explained above with regard to FIG. 12. To adjust the resistance of the (high Ohmic) series resistor and to reduce the current load, respectively, several strips may be connected in series (FIG. 13A) or in parallel (FIG. 13B).

Figure 13C:
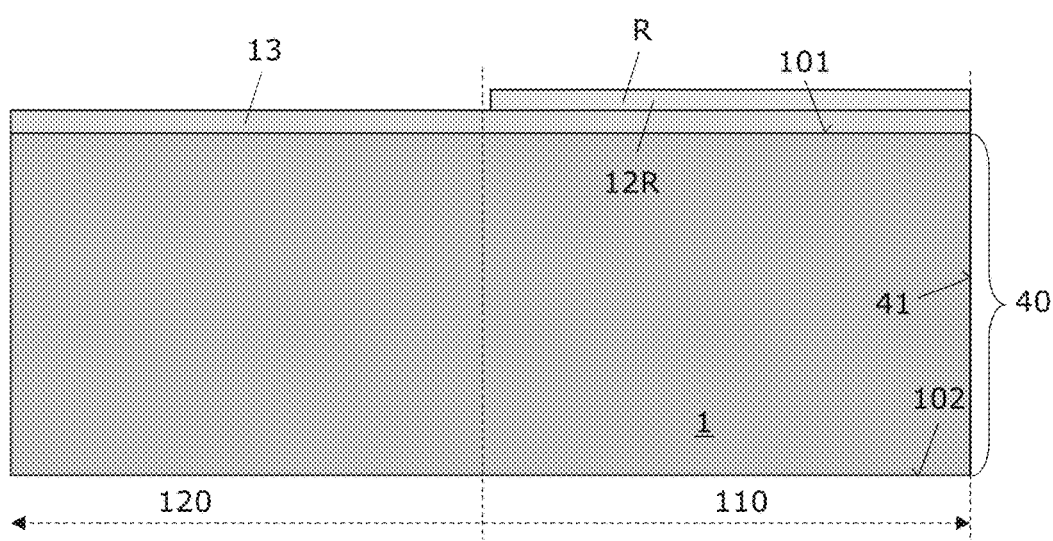
FIG. 13C illustrates a vertical cross-section through charge-compensation semiconductor device according to an embodiment.

As illustrated in FIG. 13C for the charge-compensation semiconductor device 703, the series resistor R may also be realized as a poly-Si stripe resistor 12R in the peripheral area 110, typically on the first side 101 the dielectric layer 13, respectively.

In a horizontal direction that is substantially parallel to the first surface 101, the semiconductor body 40 is typically delimited by an edge or kerf 41, for example a sawing edge, which is substantially orthogonal to the first surface 101. In the following, the edge 41 is also referred to as lateral edge 41. Typically, the peripheral area 110 (the lateral edge 41) surrounds the active area 120 when seen from above.

For sake of clarity, any details of the active area 110 are omitted in FIG. 13C.

Figure 14A:
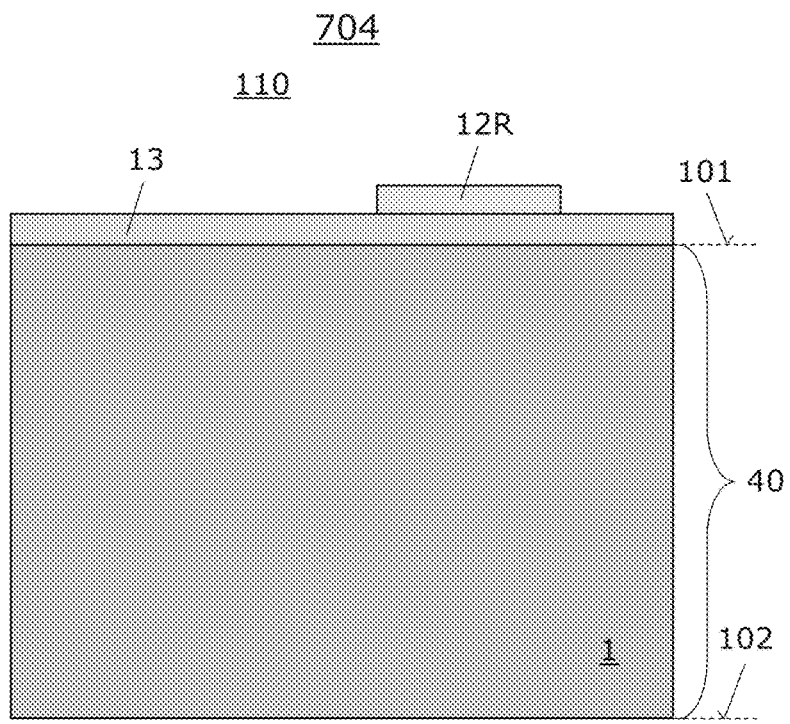
FIG. 14A illustrates a vertical cross-section through charge-compensation semiconductor device according to an embodiment.
Figure 14B:
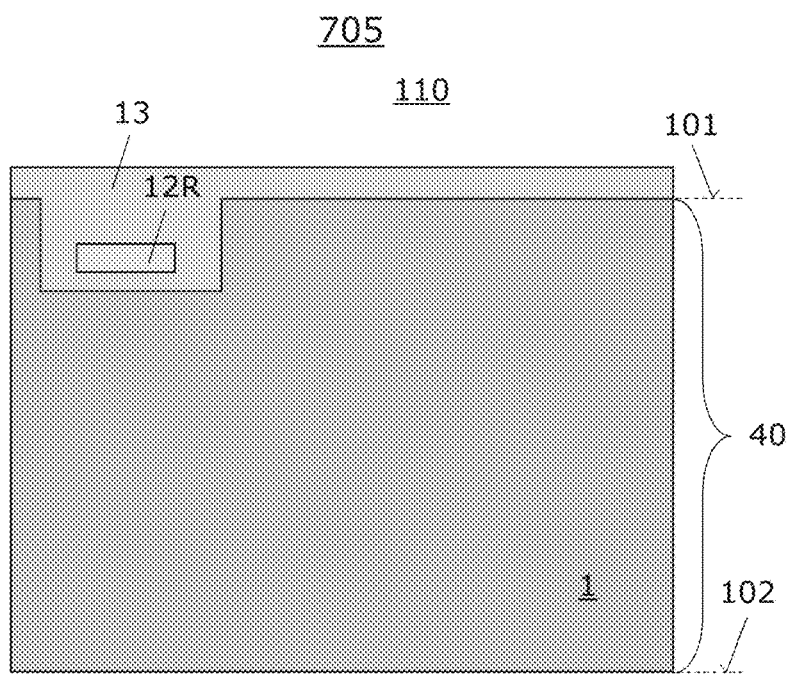
FIG. 14B illustrates a vertical cross-section through charge-compensation semiconductor device according to an embodiment.

Alternatively, the series resistor may be realized in the active area 110 as a poly-Si region 12R above the first side 101 and on the dielectric layer 13, respectively, as illustrated in FIG. 14A for the charge-compensation semiconductor device 704, or below the first side 101 as a poly-Si region 12R which dielectrically insulated except for contact areas (not shown) as illustrated in FIG. 14B for the charge-compensation semiconductor device 704. For sake of clarity, any details of the active area 110 are omitted in FIGS. 14A, 14B.

Figure 15:
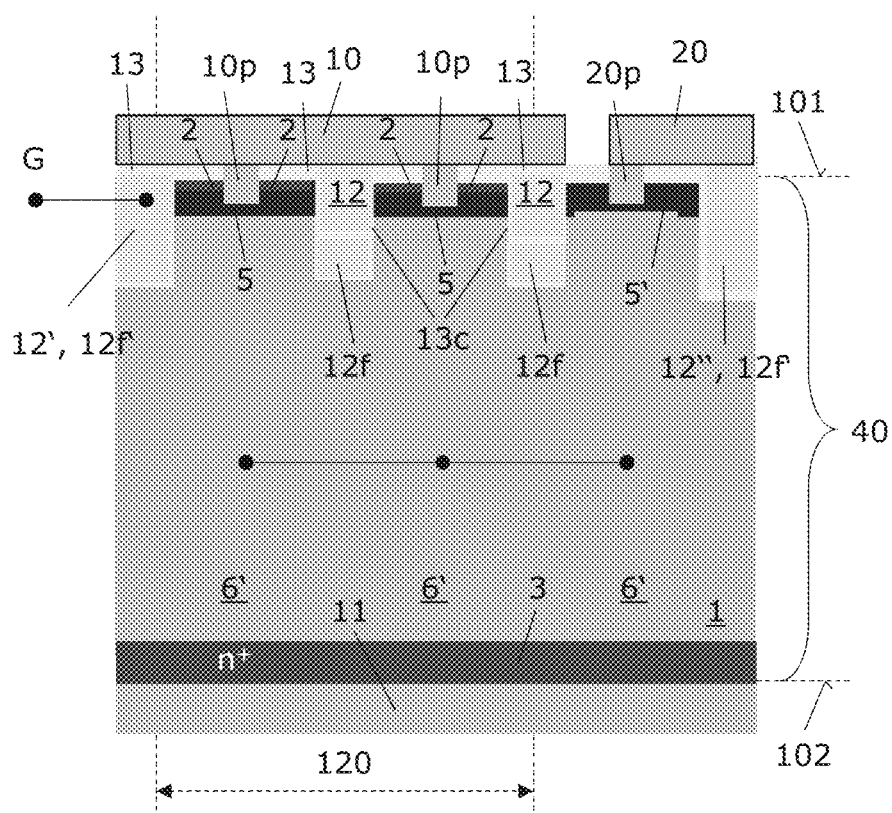
FIG. 15 illustrates a vertical cross-section through charge-compensation semiconductor device according to an embodiment.

FIG. 15 illustrates a vertical cross-section through a semiconductor body 40 of a charge-compensation semiconductor device 800. The charge-compensation semiconductor device 800 is similar to the semiconductor device 700 explained above with regard to FIG. 12, and is also implemented as charge-compensation MOSFET.

However, the contact between the compensation regions 6' and the series resistor implemented as field electrode 12f' is realized via a metallization 20 arranged on the dielectric layer 13 directly adjoining the field electrode 12f'.

In the exemplary embodiment, the right compensation regions 6' extends to the inactive body region 5' which is contacted to metallization 20 via a contact portion 20p.

Figure 16:
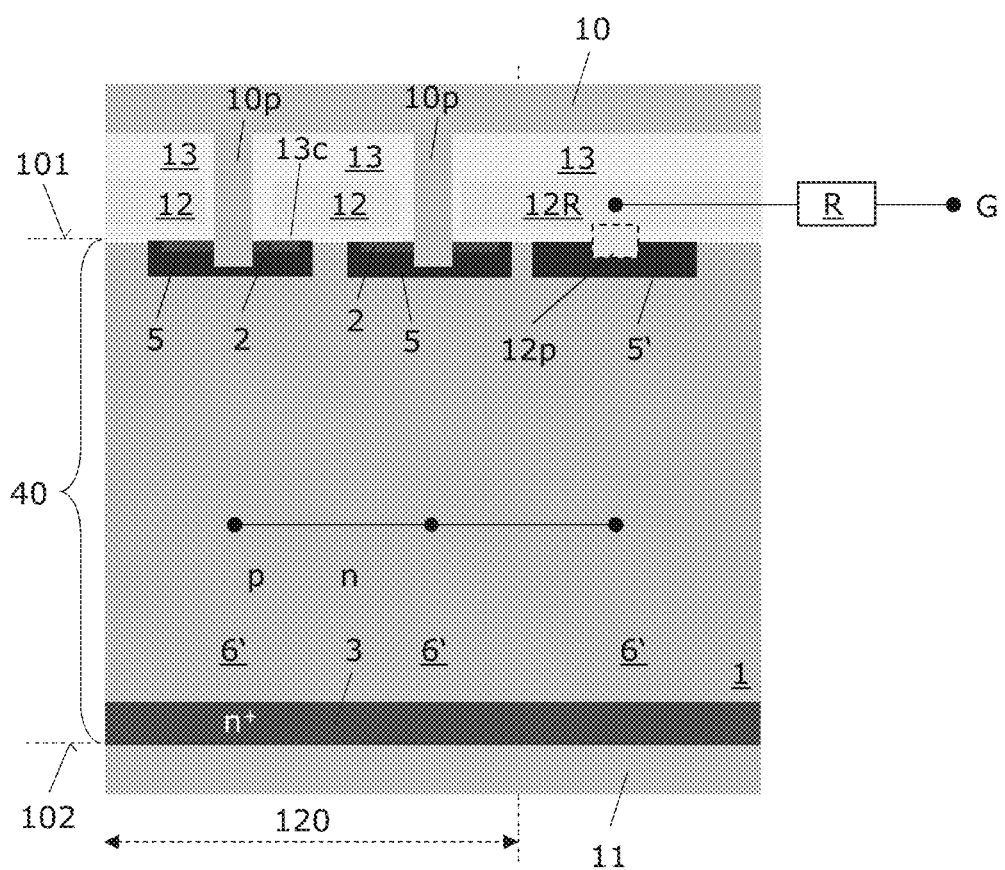
FIG. 16 illustrates a vertical cross-section through charge-compensation semiconductor device according to an embodiment.

As illustrated in FIG. 16 for the charge-compensation semiconductor device 900, the contact between a (poly-Si) series resistor 12R, R arranged on the first side 101 and the compensation regions 6' may also be done vertically via (poly-Si) trench contact 12p extending into the inactive body region 5'.

Figure 17A:
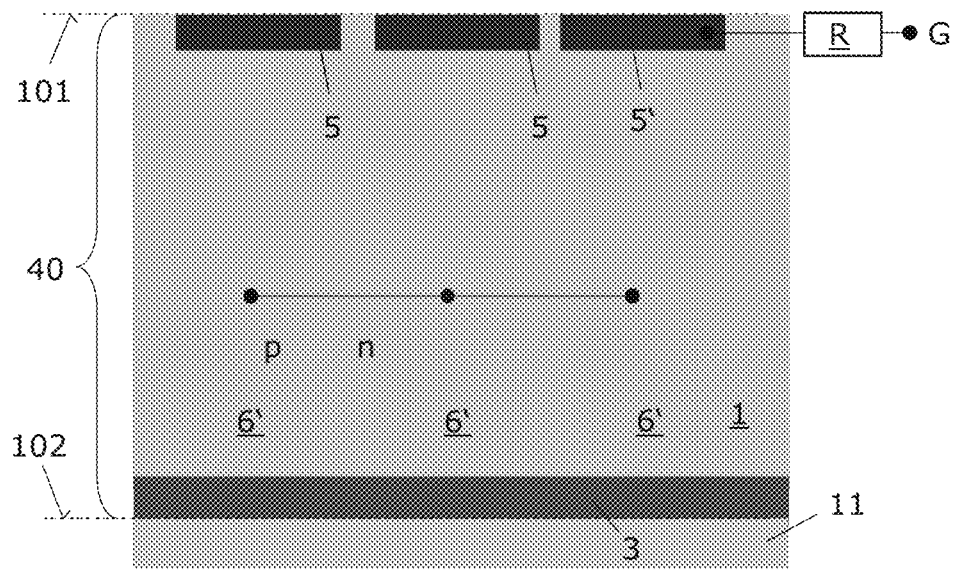
FIG. 17A illustrates a vertical cross-section through charge-compensation semiconductor device according to an embodiment.
Figure 17B:
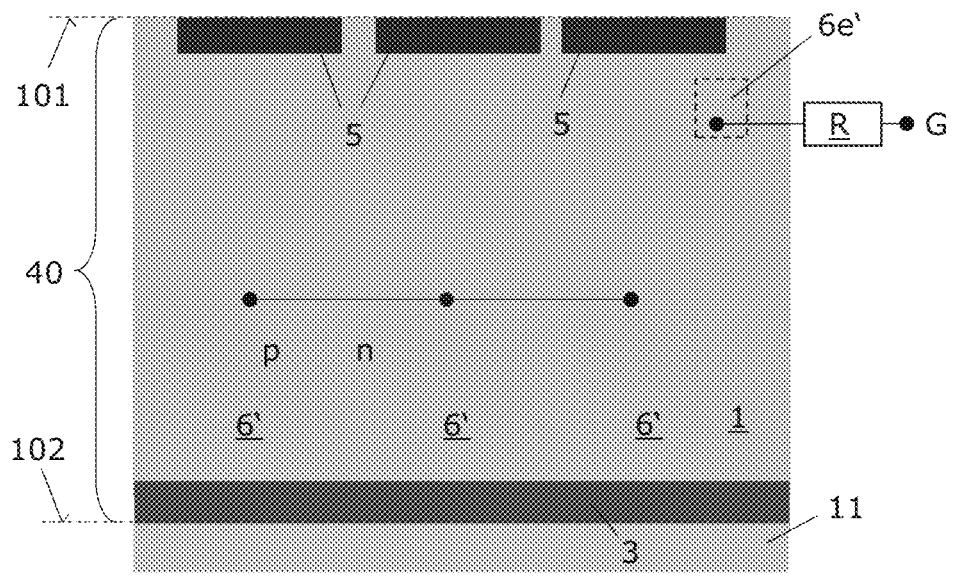
FIG. 17B illustrates a vertical cross-section through charge-compensation semiconductor device according to an embodiment.

As illustrated in FIGS. 17A and 17B for the charge-compensation semiconductor device 901 and 902, the contact between the series resistor R and the first compensation regions 6' may be realized via an inactive body region 5' to which one of the compensation regions 6' extends to (FIG. 17A) or a lateral extension portion 6e' of a compensation regions 6' (FIG. 17B, see also FIG. 12).

Charge-compensation semiconductor devices may be produced with a so-called 'multiple epitaxy' process. In this case, an n-doped epitaxial layer, which may be several μm thick, is first grown on a highly n-doped substrate and commonly referred to as 'buffer epi'. In addition to a doping level introduced in the epitaxial step doping ions are introduced into the buffer epi through a mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge-compensation regions (compensation regions) and n-type charge-compensation regions (drift portions). The manufacturing of the actual devices can then be conducted at this point.

Another technique for fabricating charge-compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, deep trenches are etched, which determine the form of the p-columns (compensation regions). The deep trenches are then filled with p-doped epi which is at least substantially free of crystal defects.

Both techniques may be used to manufacture the charge-compensation semiconductor devices as explained above with regard to FIGS. 1 to 17B.

According to an embodiment, a charge-compensation semiconductor device includes a gate metallization, a drain metallization, a semiconductor body including a first side, and a drift region in Ohmic connection with the drain metallization. In a vertical cross-section perpendicular to the first side, the charge-compensation semiconductor device includes several body regions arranged in the semiconductor body adjacent to the first side, wherein each of the body regions forms a respective first pn-junction with the drift region, several compensation regions each forming a respective further pn-junction with the drift region, wherein each of the compensation regions is arranged between the second side and one of the body regions, and several gate electrodes in Ohmic connection with the gate metallization, arranged adjacent to the first side and separated from the body regions and the drift region by a dielectric region. A rectifying current path running through the drift region and one of the compensation regions is formed between the gate metallization and the drain metallization.

Typically, the rectifying path includes a pn-junction formed between the one of the compensation regions and has in forward direction of the pn-junction an electrical resistance of at least about 100 Ohm, more typically at least about 1 k Ohm (referred to 1 mm$^2$ active area; see above).

According to an embodiment of a charge-compensation semiconductor device, the charge-compensation semiconductor device includes a gate metallization and a semiconductor body. The semiconductor body includes a first side, a second side opposite the first side, a drift region arranged between the second side and the first side, several body regions arranged in the semiconductor body adjacent to the first side, each of the body regions forming a respective first pn-junction with the drift region, and several compensation regions each forming a respective further pn-junction with the drift region. Each of the compensation regions is arranged between the second side and one of the body regions. Several gate electrodes in Ohmic connection with the gate metallization are arranged adjacent to the first side and separated from the body regions and the drift region by a dielectric region. A resistive current path is formed between one of the gate electrodes and one of the compensation regions.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents

What is claimed is:

1. A charge-compensation semiconductor device, comprising:
   a semiconductor body comprising:
      a first side;
      a second side opposite the first side; and
      a drift region arranged between the second side and the first side;
   a source metallization arranged on the first side;
   a gate metallization,
   in a vertical cross-section perpendicular to the first side, the charge-compensation semiconductor device comprising:
      two body regions arranged in the semiconductor body adjacent to the first side, wherein each of the two body regions forms a first pn-junction with the drift region;

a source region arranged in the semiconductor body, and in Ohmic connection with the source metallization, wherein the source region is arranged between the first side and one of the two body regions, and forms a second pn-junction with the one of the two body regions;

a gate electrode in Ohmic connection with the gate metallization, arranged adjacent to the first side, and separated from the source region, the one of the two body regions and the drift region by a dielectric region; and two compensation regions each forming a respective further pn-junction with the drift region, wherein each of the two compensation regions is arranged between the second side and one of the body regions, wherein an Ohmic connection is formed between a first compensation region of the two compensation regions and the gate metallization, or between the first compensation region and a further metallization which is neither connected with the source metallization nor with the gate metallization.

2. The charge-compensation semiconductor device of claim 1, further comprising a resistor connected in series between the first compensation regions and the gate metallization and/or providing the Ohmic connection between the first compensation region and the gate metallization, wherein at least one of:

the resistor has an electric resistivity so that a voltage of the first compensation regions is at a first voltage when a source voltage is applied to the source metallization, and a gate voltage different to the source voltage is applied to the gate metallization;

the first voltage is larger than the source voltage and lower than the gate voltage;

an absolute value of the first voltage is at least about an absolute value of the source voltage plus a twentieth of a first threshold voltage of the first pn-junction;

the absolute value of the first voltage is at most about an absolute value of the gate voltage;

the absolute value of the first voltage is less than the absolute value of the gate voltage; and the absolute value of the first voltage ranges from about the absolute value of the source voltage plus a tenth of the first threshold voltage to about four fifth of the absolute value of the gate voltage.

3. The charge-compensation semiconductor device of claim 2, wherein the resistor is at least substantially formed as a conductor path which is at least substantially parallel to the first side and/or arranged next to the first side.

4. The charge-compensation semiconductor device of claim 2, wherein at least one of:

the source region and the gate electrode are arranged in an active area of the charge-compensation semiconductor device;

an electrical resistance of the resistor times a surface area of the active area is at least about 0.1 k Ohm mm$^2$; and the electrical resistance times the surface area is less than about 100 k Ohm mm$^2$.

5. The charge-compensation semiconductor device of claim 2, wherein at least one of:

an electrical resistance of the resistor is at least about 100 Ohm;

the electrical resistance of the resistor is less than about 100 k Ohm;

the charge-compensation semiconductor device comprises a plurality of first compensation region; and the charge-compensation semiconductor device comprises a second compensation region arranged below a body region, forming a respective further pn-junction with the drift region and in Ohmic connection with the source metallization.

6. The charge-compensation semiconductor device of claim 1, further comprising a diode connected between the source metallization and the first compensation region.

7. The charge-compensation semiconductor device of claim 1, wherein a second one of the two body regions does not adjoin a source region and/or forms only one pn-junction in the semiconductor body.

8. The charge-compensation semiconductor device of claim 1, wherein the two compensation regions are in Ohmic connection.

9. A charge-compensation semiconductor device, comprising:

a gate metallization;

a source metallization spaced apart from the gate metallization;

a semiconductor body comprising:
 a first side;
 a second side opposite the first side;
 a drift region arranged between the second side and the first side;
 a plurality of body regions arranged in the semiconductor body adjacent to the first side, wherein each of the body regions forms a respective first pn-junction with the drift region; and
 a plurality of compensation regions arranged between the second side and the body regions, wherein each of the compensation regions forms a respective further pn-junction with the drift region;

a plurality of gate electrodes in Ohmic connection with the gate metallization, arranged adjacent to the first side and separated from the body regions and the drift region by a dielectric region; and a resistive current path formed between one of the gate electrodes and a first one of the compensation regions, or between the first one of the compensation regions and a further metallization spaced apart from the source metallization and the gate metallization.

10. The charge-compensation semiconductor device of claim 9, wherein the resistive current path is at least substantially formed as a strip conductor running substantially parallel to the first side and/or the second side.

11. The charge-compensation semiconductor device of claim 9, wherein an electrical resistance of the resistive current path is at least about 100 Ohm, and/or wherein the electrical resistance times a surface area of an active area of the charge-compensation semiconductor device is at least about 0.1 k Ohm mm$^2$.

12. The charge-compensation semiconductor device of claim 9, wherein the electrical resistance of the resistive current path is less than about 100 k Ohm, and/or wherein the electrical resistance times a surface area of an active area of the charge-compensation semiconductor device is less than about 100 k Ohm mm$^2$.

13. The charge-compensation semiconductor device of claim 9, further comprising an additional rectifying current path formed between the source metallization and the first compensation region.

14. The charge-compensation semiconductor device of claim 9, further comprising a source region arranged in the semiconductor body and in Ohmic connection with the source metallization, wherein at least one of:

the source region forms a second pn-junction with one of the body regions;

at least one of the compensation regions is in Ohmic connection with the source metallization; and at least one of the compensation regions comprises an upper portion in Ohmic connection with the source metallization and a lower portion which is spaced apart from the upper portion by a portion of the drift region.

15. The charge-compensation semiconductor device of claim 9, further comprising a drain metallization in Ohmic connection with the drift region, wherein a rectifying current path is formed between the gate metallization and the drain metallization, and/or wherein the rectifying current path crosses the further pn-junction.

16. The charge-compensation semiconductor device of claim 9, further comprising, in a vertical cross-section perpendicular to the first side, a first field electrode arranged below and in Ohmic contact with one of the gate electrodes and a second field electrode, the first field electrode and the second field electrode being contiguous when seen in a projection to the first side.

17. The charge-compensation semiconductor device of claim 16, wherein the second field electrode is in Ohmic contact with the first compensation region, and/or wherein the second field electrode is in Ohmic connection with one of the body regions extending to the first compensation region.

18. A static transfer switch comprising the charge-compensation semiconductor device of claim 9.

19. The static transfer switch of claim 18, wherein the Ohmic connection is formed between the first compensation region and the further metallization, the static transfer switch further comprising a control circuit comprising:

a source input;
a gate input;
a control input; and
a controlled output connected with the further metallization, wherein the control circuit is switchable via the control input between a first state and a second state, wherein the source input and the controlled output are short circuited in the first state, and wherein the gate input and the controlled output are short circuited in the second state or electrically connected with each other via a resistor of the control circuit having an electric resistance of at least 100 Ohm.

20. A method for forming a charge-compensation semiconductor device, the method comprising:

providing a semiconductor body comprising a first side and a second side opposite the first side, and comprising a drift region, a plurality of body regions each forming a respective first pn-junction with the drift region, and a plurality of compensation regions each forming a respective further pn-junction with the drift region, wherein each of the compensation regions is arranged between the second side and an adjacent one of the body regions;

forming a plurality of gate electrodes adjacent to the first side and separated from the body regions and the drift region by a dielectric region so that a resistive current path is formed between one of the gate electrodes and one of the compensation regions.

* * * * *

UNITED STATES PATENT AND TRADEMARK OFFICE
CERTIFICATE OF CORRECTION

PATENT NO. : 10,490,656 B2
APPLICATION NO. : 16/031113
DATED : November 26, 2019
INVENTOR(S) : A. Wilmeroth et al.

Page 1 of 1

It is certified that error appears in the above-identified patent and that said Letters Patent is hereby corrected as shown below:

In the Claims

Column 19, Line 44 (Claim 2, Line 23) please change "fifth" to --fifths--
Column 19, Line 66 (Claim 5, Line 8) please change "region" to --regions--

Signed and Sealed this
Fourth Day of February, 2020

Andrei Iancu
*Director of the United States Patent and Trademark Office*